United States Patent
Chae et al.

(10) Patent No.: US 8,247,806 B2
(45) Date of Patent: Aug. 21, 2012

(54) FIELD EFFECT TRANSISTOR HAVING GRAPHENE CHANNEL LAYER

(75) Inventors: Byung-Gyu Chae, Daejeon (KR); Hyun Tak Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 297 days.

(21) Appl. No.: 12/649,321

(22) Filed: Dec. 29, 2009

(65) Prior Publication Data

US 2010/0258787 A1 Oct. 14, 2010

(30) Foreign Application Priority Data

Apr. 8, 2009 (KR) .................. 10-2009-0030516

(51) Int. Cl.
*H01L 51/30* (2006.01)
(52) U.S. Cl. .................. 257/40; 257/E51.038
(58) Field of Classification Search .................. None
See application file for complete search history.

(56) References Cited

U.S. PATENT DOCUMENTS

| | | | | |
|---|---|---|---|---|
| 7,732,859 B2* | 6/2010 | Anderson et al. | ............. | 257/328 |
| 7,858,989 B2* | 12/2010 | Chen et al. | ............. | 257/76 |
| 7,858,990 B2* | 12/2010 | Chen et al. | ............. | 257/76 |
| 8,076,204 B2* | 12/2011 | Anderson et al. | ............. | 438/283 |
| 2009/0020764 A1* | 1/2009 | Anderson et al. | ............. | 257/77 |
| 2009/0221130 A1* | 9/2009 | Asano | ............. | 438/478 |
| 2010/0006823 A1* | 1/2010 | Anderson et al. | ............. | 257/24 |
| 2011/0114914 A1* | 5/2011 | Numata et al. | ............. | 257/9 |

FOREIGN PATENT DOCUMENTS

KR 2008-0100430 A 11/2008

OTHER PUBLICATIONS

M.C. Lemme et al., "A Graphene Field Effect Device", IEEE Electron Device Letters, vol. 28, No. 4, Apr. 2007.

* cited by examiner

*Primary Examiner* — Benjamin Sandvik
(74) *Attorney, Agent, or Firm* — Rabin & Berdo, P.C.

(57) ABSTRACT

Provided is a field effect transistor including a graphene channel layer, and capable of increasing an on/off ratio of an operating current by using the graphene of the graphene channel layer. The field effect transistor includes: a substrate; the graphene channel layer which is disposed on a portion of the substrate and includes graphene; a first electrode disposed on a first region of the graphene channel layer and a portion of the substrate; an interlayer disposed on a second region of the graphene channel layer, which is apart from the first region, and a portion of the substrate; a second electrode disposed on the interlayer; a gate insulation layer disposed on a portion of the graphene channel layer, the first electrode, and the second electrode; and a gate electrode disposed on a portion of the gate insulation layer.

12 Claims, 7 Drawing Sheets

FIELD EFFECT TRANSISTOR HAVING GRAPHENE CHANNEL LAYER

CROSS-REFERENCE TO RELATED PATENT APPLICATION

This application claims the benefit of Korean Patent Application No. 10-2009-0030516, filed on Apr. 8, 2009, in the Korean Intellectual Property Office, the disclosure of which is incorporated herein in its entirety by reference.

BACKGROUND OF THE INVENTION

1. Field of the Invention

The present invention relates to a field effect transistor, and more particularly, to a field effect transistor using graphene in a channel layer.

2. Description of the Related Art

Kostya Novoselov and Andre Geim were first to discover how to fabricate graphene, which consists of two dimensional carbon atoms in a hexagonal structure, by mechanically exfoliating graphite, and have reported field effect characteristics exhibited by the graphene, numerous attempts of fabricating highly efficient transistors with high operating speed using graphene are being made.

Graphene is a carbon nanostructure that has a two-dimensional shape, high charge mobility of approximately 15,000 $cm^2/Vs$, and excellent thermal conductivity. Thus, the graphene is considered as a next-generation material for replacing silicon that is currently being used in field effect transistors. Large area integration is difficult in the case of using carbon nanotubes in the formation of transistors. However, if graphene material is used in the formation of transistors, a device can be easily fabricated using conventional semiconductor fabricating techniques, and particularly, large area integration can easily be achieved.

However, graphene is a semi-metal having a zero energy band gap, that is, having no energy band gap. Therefore, graphene has a very large off current, and thus an on/off ratio of an operating current is very small. The maximum on/off ratio of a field effect transistor using semi-metallic graphene as known hitherto is approximately 6. Such a low on/off ratio works against large integration and high-speed operation of a field effect transistor.

Recently, various attempts have been made to increase the on/off ratio of the operating current of a field effect transistor. One of those attempts is fabrication of a semiconductor graphene having a proper energy band gap for an effective field effect. Zhang et al. have simulated nanoribbon tunnel transistor model using a semiconductor graphene and suggested a method of increasing an on/off ratio of a field effect transistor using graphene. On the other hand, Lemme et al. have fabricated a non-volatile field effect switching device having a very high on/off ratio by changing the chemical composition of graphene. Accordingly, a graphene layer having a energy band gap is embodied by ridding of the symmetry of a graphene crystal structure exhibited by lattice mismatch between graphene and a substrate, by forming a nanoribbon shape pattern, or by changing the chemical composition of graphene.

However, according to the suggested methods described above, it is difficult to embody graphene in the size of several nano meters, and with excellent quality. Thus, despite of the excellent characteristics of graphene, the integration of graphene to a semiconductor device hasn't been successfully accomplished yet.

SUMMARY OF THE INVENTION

The present invention provides a field effect transistor having a graphene channel layer, that is, a field effect transistor capable of increasing an on/off ratio of an operating current by using graphene in a channel layer.

According to an aspect of the present invention, there is provided a field effect transistor including a graphene channel layer. The field effect transistor includes: a substrate; the graphene channel layer which is disposed on a portion of the substrate and includes graphene; a first electrode disposed on a first region of the graphene channel layer and a portion of the substrate; an interlayer disposed on a second region of the graphene channel layer, which is apart from the first region, and a portion of the substrate; a second electrode disposed on the interlayer; a gate insulation layer disposed on a portion of the graphene channel layer, the first electrode, and the second electrode; and a gate electrode disposed on a portion of the gate insulation layer.

In some embodiments of the present invention, the graphene may be semi-metal graphene having no band gap and the level of the Fermi surface changes by a voltage applied to the gate electrode.

In some embodiments of the present invention, the second electrode may overlap with the graphene channel layer and the interlayer 130 may be interposed therebetween.

In some embodiments of the present invention, the interlayer may include an insulation layer.

In some embodiments of the present invention, the second electrode may covers the interlayer either completely or partially, and the interlayer may include an insulation layer.

In some embodiments of the present invention, a thickness of the interlayer may be sufficient to cause a tunnelling effect between the graphene channel layer and the second electrode.

In some embodiments of the present invention, each of the first electrode and the second electrode may be either a source electrode or a drain electrode.

According to an aspect of the present invention, there is provided a field effect transistor including a graphene channel layer. The field effect transistor includes: a substrate; the graphene channel layer which is disposed on a portion of the substrate and includes graphene; a first electrode disposed on a first region of the graphene channel layer and a portion of the substrate; an interlayer disposed on a second region of the graphene channel layer, which is apart from the first region, and a portion of the substrate; a second electrode disposed on a portion of the interlayer; a gate insulation layer disposed on a portion of the graphene channel layer, the first electrode, the interlayer, and the second electrode; and a gate electrode disposed on a portion of the gate insulation layer.

In some embodiments of the present invention, the graphene may be semi-metal graphene having no band gap and the level of the Fermi surface changes by a voltage applied to the gate electrode.

In some embodiments of the present invention, the second electrode may be apart from the graphene channel layer by an interlayer that is interposed therebetween, and the second electrode and the graphene channel layer may not overlap.

In some embodiments of the present invention, the interlayer may include a semiconductor having a band gap of a size with which a field effect occurs due to a voltage applied to the gate electrode.

In some embodiments of the present invention, a thickness interlayer may be sufficient to cause a tunnelling effect between the graphene channel layer and the second electrode.

In some embodiments of the present invention, the interlayer may include semiconductor graphene or graphene oxide.

According to an aspect of the present invention, there is provided a field effect transistor including a graphene channel layer. The field effect transistor includes: a substrate; the graphene channel layer which is disposed on a portion of the substrate and includes graphene; interlayers respectively disposed on a first region and a second region of the graphene channel layer, where the second region is apart from the first region; a first electrode disposed on the interlayer that is on the first region of the graphene channel layer; a second electrode disposed on the interlayer that is on the second region of the graphene channel layer; a gate insulation layer disposed on a portion of the graphene channel layer, the first electrode, and the second electrode; and a gate electrode disposed on a portion of the gate insulation layer.

In some embodiments of the present invention, the graphene may be semiconductor graphene having a band gap.

In some embodiments of the present invention, each of the first electrode and the second electrode may overlap with the graphene channel layer, and the interlayers may be respectively interposed between the first electrode and the graphene channel layer and between the second electrode and the graphene channel layer.

In some embodiments of the present invention, the interlayer may be a semiconductor layer doped with an impurity.

In some embodiments of the present invention, the interlayer and the graphene channel layer may mutually form a semiconductor junction and may form a depletion layer with respect to a voltage applied in a reverse current direction with respect to the semiconductor junction.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
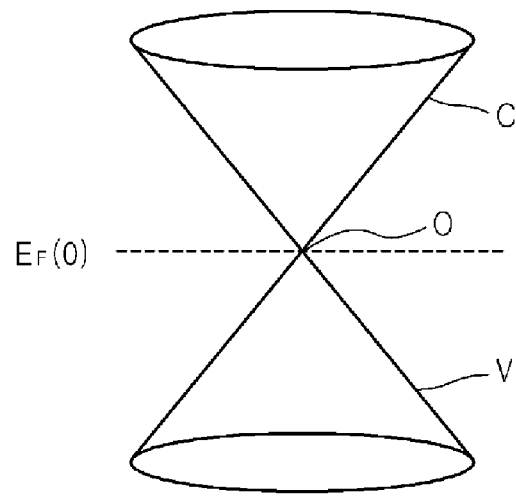
FIGS. 1A and 1B are schematic diagrams showing changes in a Fermi surface of the energy band structure of a semi-metal graphene material when an external voltage is not applied thereto and when an external voltage is applied thereto, respectively.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the exemplary embodiments of the inventive concept will be described in detail with reference to the accompanying drawings. In the drawings, variations from the shapes of the illustrations as a result, for example, of manufacturing techniques and/or tolerances, are to be expected. Thus, the example embodiments should not be construed as limited to the particular shapes of regions illustrated herein but may be to include deviations in shapes that result, for example, from manufacturing.

Figure 1B:
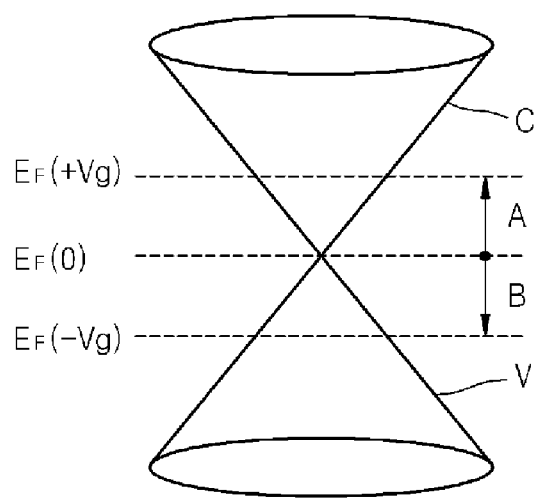

FIGS. 1A and 1B are schematic diagrams showing changes in a Fermi surface of the energy band structure of a semi-metal graphene material when an external voltage is not applied thereto and when an external voltage is applied thereto, respectively.

Referring to FIG. 1A, the energy band of a semi-metal graphene material is shown. The semi-metal graphene material has a band structure including a region O in which a conduction band C and a valence band V lightly overlap each other. The main carrier of the conduction band C is an electron; whereas the main carrier of the valence band V is a hole. In case where no external voltage is applied to the graphene material, the initial energy level $E_F(0)$ of the Fermi surface is located within the region O Referring to FIG. 1B, when a positive gate voltage $(+V_g)$ is applied to the graphene material, the initial energy level $E_F(0)$ of the Fermi surface moves in the conduction band C to a first energy level $E_F(+V_g)$, as indicated by the arrow A. When a negative gate voltage $(-V_g)$ is applied to the graphene material, the initial energy level $E_F(0)$ of the Fermi surface moves in the valence band V to a second energy level $E_F(-V_g)$, as indicated by the arrow B. In other words, the energy level of the Fermi surface of the graphene material may be moved by applying an external gate voltage to the graphene material, and either an electron or a hole may be selected as the main carrier according to the polarity of the applied gate voltage.

Although not shown, graphene material may be in a semiconductor state. In this case, the semiconductor graphene material has a band gap between the valence band V and the conduction band C.

Figure 2:
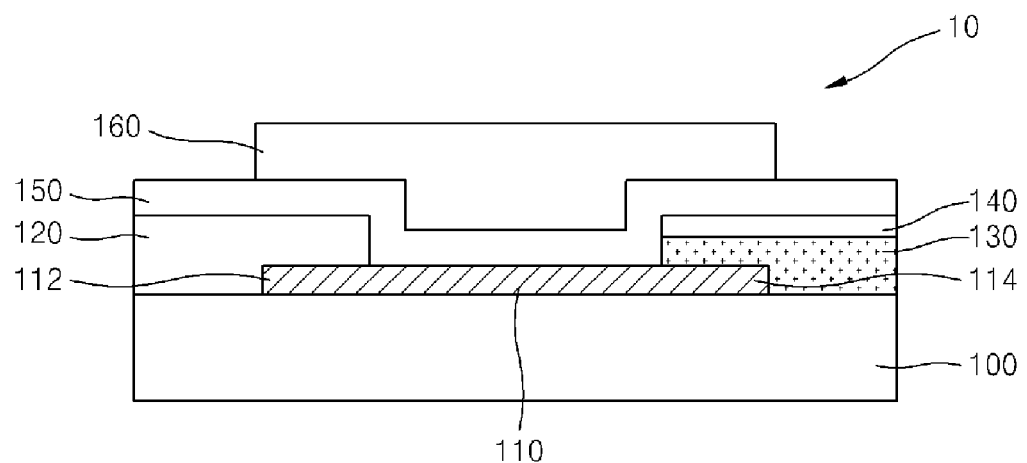
FIG. 2 is a cross-sectional view of a field effect transistor including a semi-metal graphene channel layer, according to some embodiments of the present invention.

FIG. 2 is a cross-sectional view of a field effect transistor 10 including a semi-metal graphene channel layer 110, according to some embodiments of the present invention.

Referring to FIG. 2, the field effect transistor 10 includes a substrate 100, the graphene channel layer 110, a first electrode 120, an interlayer 130, a second electrode 140, a gate insulation layer 150, and a gate electrode 160.

The graphene channel layer 110 is disposed on a portion of the substrate 100. The graphene channel layer 110 includes a first region 112 and a second region 114 that are apart from each other. The first region 112 and the second region 114 may be disposed at two opposite ends of the graphene channel layer 110. The first electrode 120 is disposed on the first region 112 of the graphene channel layer 110. The first electrode 120 may extend such that a portion of the same is disposed on the substrate 100. The interlayer 130 is disposed on the second region 114 of the graphene channel layer 110. The interlayer 130 may extend such that a portion of the same is disposed on the substrate 100. The second electrode 140 is disposed on the interlayer 130. The second electrode 140 may either entirely or partially cover the interlayer 130. The first electrode 120 and the second electrode 140 are apart from each other with respect to the graphene channel layer 110. The gate insulation layer 150 is disposed on a portion of the graphene channel layer 110, the first electrode 120, and the second electrode 140. The gate electrode 160 is disposed on a portion of the gate insulation layer 150.

The substrate 100 may be formed of various materials, e.g. silicon, silicon-germanium, silicon carbide, glass, or plastic. Furthermore, the substrate 100 may include an epitaxial layer, a silicon-on-insulator (SOI) layer, a semiconductor-on-insulator (SEOI) layer, etc.

The graphene channel layer 110 may include semi-metal graphene having the energy states shown in FIGS. 1A and 1B. As described above, when an external voltage is applied to the gate electrode 160, the energy level of the Fermi surface may change. The graphene channel layer 110 may be formed of a graphite crystal by using a mechanical exfoliating method or an electrostatic exfoliating method. Alternatively, the graphene channel layer 110 may be formed by using a pyrolysis method for silicon carbide, an extraction method using oxidizers such as hydrazine ($NH_2NH_2$), or a chemical vapor deposition (CVD) method using a reactant gas including hydrogen and carbon.

The first electrode 120 and the second electrode 140 may be electrically interconnected through the graphene channel layer 110, and each may be either a source electrode or a drain electrode. The first electrode 120 and the second electrode 140 may include a conductive material, e.g. poly-silicon or indium-tin oxide (ITO). Alternatively, the first electrode 120 and the second electrode 140 may include metals, e.g. at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The first electrode 120 and the second electrode 140 may be formed by using a deposition method such as CVD, plasma enhanced CVD (PECVD), low pressure CVD (LPCVD), physical vapor deposition (PVD), sputtering, atomic layer deposition (ALD), etc.

The interlayer 130 may include an insulation material that has a band gap of a size with which a field effect does not occur due to a voltage applied to the gate electrode 160 or a band gap of a size with which the field effect barely occurs due to a voltage applied to the gate electrode 160. In case where the interlayer 130 includes an insulation material, the second electrode 140 is disposed such that the second electrode 140 overlaps with the graphene channel layer 110 and the interlayer 130 is interposed therebetween. Furthermore, the interlayer 130 may have a thickness sufficient to cause a tunnelling effect between the graphene channel layer 110 and the second electrode 140. The interlayer 130 may include, for example, an oxide, a nitride, or an oxinitride; e.g. a silicon oxide, a silicon nitride, or a silicon oxinitride. Alternatively, the interlayer 130 may include an organic polymer, e.g. poly methyl methacrylate (PMMA).

The gate insulation layer 150 may include an insulation material, e.g. a silicon oxide, a silicon nitride, or a silicon oxinitride. Furthermore, the gate insulation layer 150 may be a multi-layer having a structure in which a silicon oxide and a silicon nitride are stacked, or may be a silicon oxide layer which is partially nitrified. The nitrification of the silicon oxide layer may be performed by using a method such as annealing or rapid thermal annealing (RTA) using a gas including nitrogen (e.g. NH3 gas), laser RTA, etc. Furthermore, the nitrification of the silicon oxide layer may also be performed by using another method such as plasma nitrification, plasma ion implantation, PECVD, high density plasma CVD (HDP-CVD), or radical nitrification. After the nitrification of the silicon oxide layer, the above-described structure may be thermally processed in inert gas including an inert gas, for example, helium or argon. The nitrified surface of the gate insulation layer 150 may face the gate electrode 160 subsequently formed.

The gate electrode 160 may include a conductive material, e.g. poly-silicon or metal. The metal may include at least one of Al, Au, Be, Bi, Co, Cu, Hf, In, Mn, Mo, Ni, Pb, Pd, Pt, Rh, Re, Ru, Ta, Te, Ti, W, Zn, and Zr. The gate electrode 160 may be formed by using a deposition method such as CVD, PECVD, LPCVD, PVD, sputtering, ALD, etc.

Although the field effect transistor 10 of FIG. 2 is shown as an upper gate structure, the present invention is not limited thereto and according to another embodiment, field effect transistor 10 may be formed with a lower gate structure disposed under the graphene channel layer 110, the first electrode 120, the interlayer 130, and the second electrode 140.

Figure 3A:
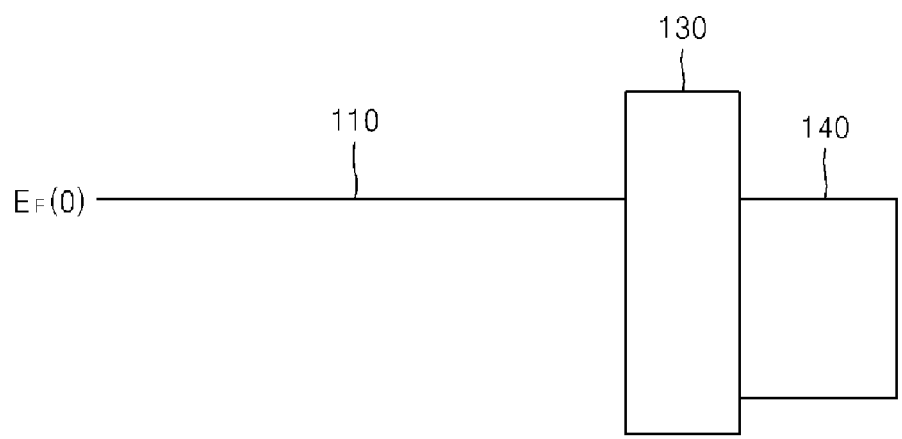
FIGS. 3A through 3C are energy band diagrams for describing the operating principle of the field effect transistor shown in FIG. 2.
Figure 3B:
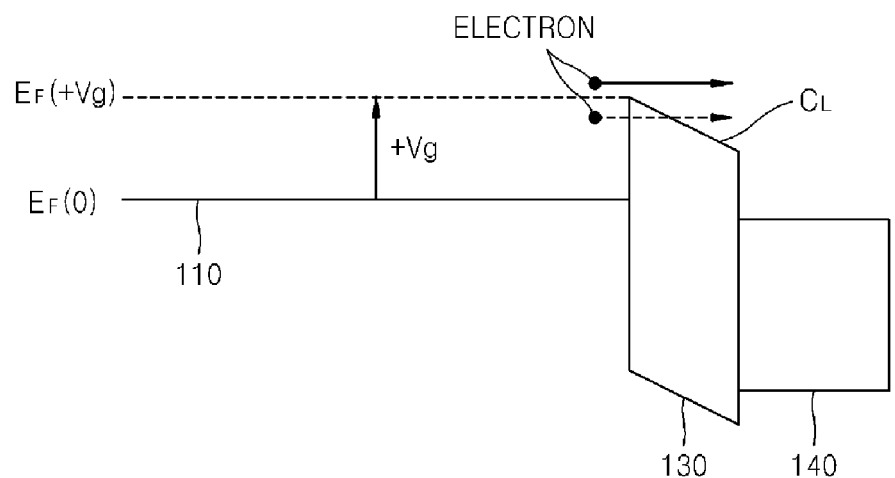
Figure 3C:
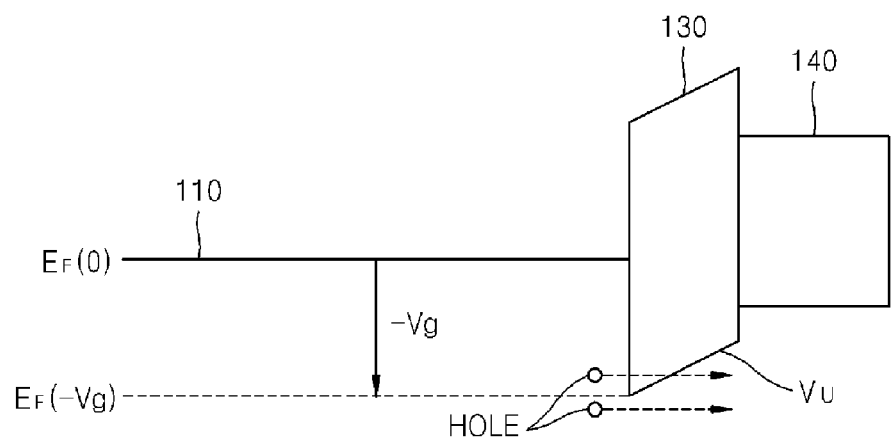

FIGS. 3A through 3C are energy band diagrams for describing the operating principle of the field effect transistor 10 shown in FIG. 2. FIG. 3B illustrates one case when the field effect transistor 10 is n-type, whereas FIG. 3C illustrates another case when the field effect transistor 10 is p-type.

Referring to FIG. 3A, in case where no voltage is applied to the gate electrode 160 of the field effect transistor 10, an energy band structure for the graphene channel layer 110, the interlayer 130 and the second electrode 140 is formed so as to have a thermodynamic equilibrium corresponding to work functions of the graphene channel layer 110 and the second electrode 140 disposed at opposite sides of the interlayer 130. The energy level of the Fermi surface of the graphene channel layer 110 is the initial energy level $E_F(0)$. Thus, there is an energy barrier between the graphene channel layer 110 and the second electrode 140 due to the interlayer 130.

Referring to FIG. 3B, in case where a positive gate voltage $+V_g$ is applied to the gate electrode 160 of the n-type field effect transistor 10, the energy band shown in FIG. 3A changes. Furthermore, the energy level of the Fermi surface of the graphene channel layer 110 is changed from the initial energy level $E_F(0)$ to a first energy level $E_F(+V_g)$. Here, since the first energy level $E_F(+V_g)$ is almost same as the lowermost level $C_L$ of the conduction band of the interlayer 130, the energy barrier due to the interlayer 130 is removed. Therefore, electrons within the graphene channel layer 110 can easily move into the second electrode 140 (indicated by the solid line arrow), and thus the n-type field effect transistor 10 becomes on-state. Furthermore, the electrons may move into the second electrode 140 due to a tunnelling effect through the interlayer 130, as indicated by the dotted line arrow.

Here, the interlayer 130 may include an insulation material as described above. A material having a band gap capable of effectively reducing the energy difference between the work function of the graphene channel layer 110 and the lowermost level $C_L$ of the conduction band of the interlayer 130 by applying a positive gate voltage $(+V_g)$ to the field effect transistor 10 is selected as the insulation material. Furthermore, in case of moving electrons by using the tunnelling effect as described above, the width of the interlayer 130 should be sufficient to cause the tunnelling effect.

Referring to FIG. 3C, in case where a negative gate voltage $-V_g$ is applied to the gate electrode 160 of the p-type field effect transistor 10, the energy band shown in FIG. 3A changes. Furthermore, the energy level of the Fermi surface of the graphene channel layer 110 is changed from the initial energy level $E_F(0)$ to the second energy level $E_F(-V_g)$. Here, since the second energy level $E_F(-V_g)$ is almost identical to the uppermost level $V_U$ of the valence band of the interlayer 130, the energy barrier due to the interlayer 130 is removed. Therefore, holes within the graphene channel layer 110 can easily move into the second electrode 140 (indicated by a solid line arrow), and thus the p-type field effect transistor 10 becomes on-state. Furthermore, the holes may move into the second electrode 140 due to a tunnelling effect through the interlayer 130, as indicated by the dotted line arrow.

Here, the interlayer 130 may include an insulation material as described above. A material having a band gap capable of effectively reducing the energy difference between the work function of the graphene channel layer 110 and the uppermost level $V_U$ of the valence band of the interlayer 130 by applying a negative gate voltage $(-V_g)$ to the field effect transistor 10 is selected as the insulation material. Furthermore, in case of moving holes by using the tunnelling effect described above, the width of the interlayer 130 should be sufficient to cause the tunnelling effect.

As described above, since the interlayer 130 has a relatively higher energy barrier as compared to the graphene channel layer 110 and the second electrode 140, an off-current cannot flow, whereas an on-current may be close to the unique characteristics of the graphene material. Thus, an on/off ratio of an operating current is increased in the field effect transistor 10 according to the current embodiment.

Figure 4:
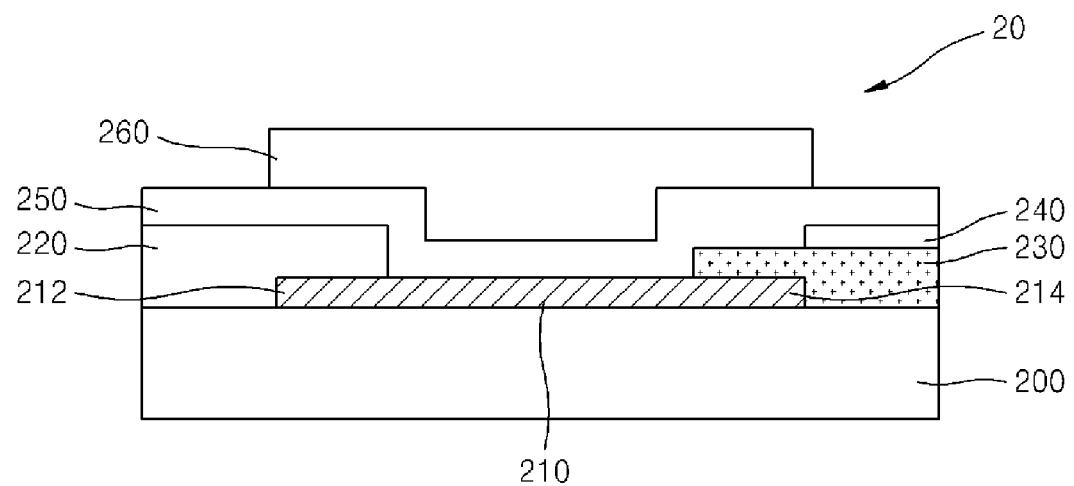
FIG. 4 is a cross-sectional view of a field effect transistor including a semi-metal graphene channel layer, according to some embodiment of the present invention.

FIG. 4 is a cross-sectional view of a field effect transistor 20 including a semi-metal graphene channel layer 210, according to some embodiment of the present invention. For convenience of explanation, duplicate descriptions of the same elements of the previous embodiment will be omitted.

Referring to FIG. 4, the field effect transistor 20 includes a substrate 200, a graphene channel layer 210, a first electrode 220, an interlayer 230, a second electrode 240, a gate insulation layer 250, and a gate electrode 260.

The graphene channel layer 210 is disposed on a portion of the substrate 200. The graphene channel layer 210 includes a first region 212 and a second region 214 that are apart from each other. The first region 212 and the second region 214 may be disposed at two opposite ends of the graphene channel layer 210. The first electrode 220 is disposed on the first region 212 of the graphene channel layer 210. The first electrode 220 may extend such that a portion of the same is disposed on the substrate 200. The interlayer 230 is disposed on the second region 214 of the graphene channel layer 210. The interlayer 230 may extend such that a portion of the same is disposed on the substrate 200. The second electrode 240 is disposed on a portion of the interlayer 230. The second electrode 240 may either entirely or partially cover the interlayer 230. The first electrode 220 and the second electrode 240 are apart from each other with respect to the graphene channel layer 210. The gate insulation layer 250 is disposed on the graphene channel layer 210, the first electrode 220, and the second electrode 240. The gate electrode 260 is disposed on a portion of the gate insulation layer 250.

The substrate 200 may be formed of various materials, as describe above. The graphene channel layer 210 may include semi-metal graphene having the energy states shown in FIGS. 1A and 1B. The first electrode 220 and the second electrode 240 may be electrically interconnected through the graphene channel layer 210, and each may be either a source electrode or a drain electrode. The first electrode 220 and the second electrode 240 may include a conductive material. The gate insulation layer 250 may include an insulation material, and the gate electrode 260 may include a conductive material.

The interlayer 230 may include a semiconductor material, and the semiconductor material may have a band gap of a size with which a field effect occurs due to a voltage applied to the gate electrode 260. In case where the interlayer 230 includes a semiconductor material, the second electrode 240 may be disposed on a portion of the interlayer 230, and, for example, the second electrode 240 may be apart from the graphene channel layer 210 by the interlayer 230 that is interposed therebetween, and the second electrode 240 and the graphene channel layer 210 do not overlap. The interlayer 230 may include, for example, silicon, germanium, silicon-germanium, a group III-V semiconductor, or a group II-VI semiconductor. Alternatively, the interlayer 230 may include graphene in a semiconductor state or graphene oxide. Furthermore, the width of the interlayer 230 may be sufficient to cause a tunnelling effect between the graphene channel layer 210 and the second electrode 240.

Although the field effect transistor 20 of FIG. 4 is shown as an upper gate structure, the present invention is not limited thereto, and thus according to another embodiment, the field effect transistor 20 may be formed with a lower gate structure disposed under the graphene channel layer 210, the first electrode 220, the interlayer 230, and the second electrode 240.

Figure 5A:
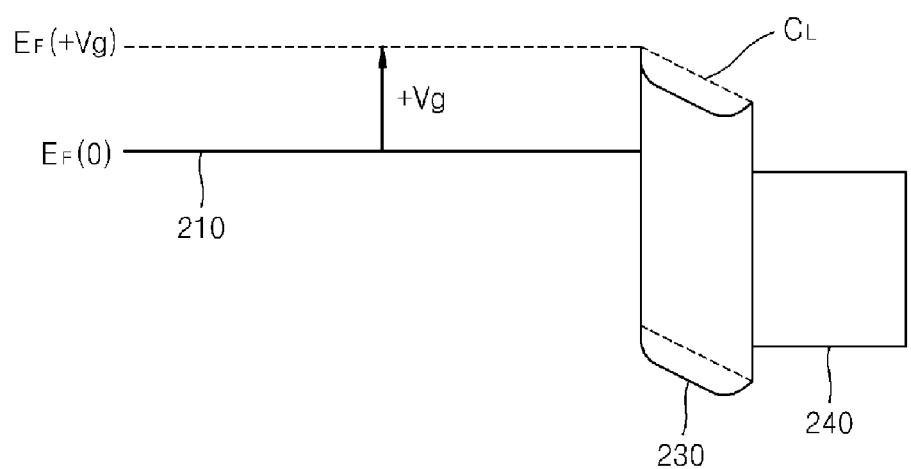
FIGS. 5A and 5B are energy band diagrams for describing the operating principle of the field effect transistor shown in FIG. 4.
Figure 5B:
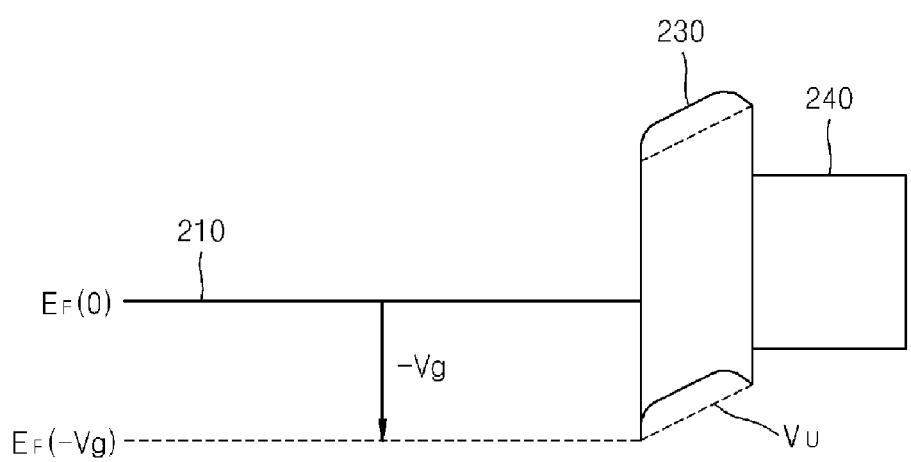

FIGS. 5A and 5B are energy band diagrams for describing the operating principle of the field effect transistor 20 shown in FIG. 4. FIG. 5A illustrates one case when the field effect transistor 20 is n-type, whereas FIG. 5B illustrates another case when the field effect transistor 20 is p-type.

In the field effect transistor 20, in case where no voltage is applied to the gate electrode 260, an energy band structure for the graphene channel layer 210, the interlayer 230 and the second electrode 240 is formed so as to have a thermodynamic equilibrium corresponding to work functions of the graphene channel layer 210 and the second electrode 240 disposed at opposite sides of the interlayer 230, as also described above in reference to FIG. 3A. The energy level of the Fermi surface of the graphene channel layer 210 is the initial energy level $E_F(0)$. Thus, there is an energy barrier between the graphene channel layer 210 and the second electrode 240 due to the interlayer 230. In the current embodiment, since the interlayer 230 includes a semiconductor material, the energy barrier of the interlayer 230 has a form different from the interlayer 130 shown in FIG. 3A. For example, in case when the field effect transistor 20 is n-type, the conduction band and the valence band of the interlayer 230 have concave shapes as shown in FIG. 5A. In contrast, in case when the field effect transistor 20 is p-type, the conduction band and the valence band of the interlayer 230 have convex shapes as shown in FIG. 5B.

Referring to FIG. 5A, in case where a positive gate voltage $+V_g$ is applied to the gate electrode 260 of the n-type field effect transistor 20, the energy band shown in FIG. 5A changes. Furthermore, the energy level of the Fermi surface of the graphene channel layer 210 is changed from the initial energy level $E_F(0)$ to the first energy level $E_F(+V_g)$. Furthermore, due to a field effect caused by the gate electrode 260, the conduction band of the interlayer 230, which has a concave shape, moves as show by the dotted line. Here, since the first energy level $E_F(+V_g)$ is almost same as the lowermost level $C_L$ of the conduction band of the interlayer 230, the energy barrier due to the interlayer 230 is removed. Therefore, electrons within the graphene channel layer 210 can easily move into the second electrode 240, and thus the n-type field effect transistor 20 becomes on-state. Furthermore, as described above, the electrons may move into the second electrode 240 due to a tunnelling effect through the interlayer 230. In this case, the width of the interlayer 230 should be sufficient to cause the tunnelling effect.

Referring to FIG. 5B, in case where a negative gate voltage $-V_g$ is applied to the gate electrode 260 of the p-type field effect transistor 20, the energy band shown in FIG. 5A changes. Furthermore, the energy level of the Fermi surface of the graphene channel layer 210 is changed from the initial energy level $E_F(0)$ to the second energy level $E_F(-V_g)$. Furthermore, due to a field effect caused by the gate electrode 260, the valence band of the interlayer 230, which has a concave shape, moves as shown by the dotted line. Here, since the second energy level $E_F(-V_g)$ is almost identical to the uppermost level $V_U$ of the valence band of the interlayer 230, the energy barrier due to the interlayer 230 is removed. Therefore, holes within the graphene channel layer 210 can easily move into the second electrode 240, and thus the p-type field effect transistor 20 becomes on-state. Furthermore, as described above, the holes may move into the second electrode 240 due to a tunnelling effect through the interlayer 230. In this case, the width of the interlayer 230 should be sufficient to cause the tunnelling effect.

As described above, since the interlayer 230 has a relatively higher energy barrier as compared to the graphene channel layer 210 and the second electrode 240, an off-current cannot flow, whereas an on-current may be close to the unique characteristics of the graphene material. Thus, an on/off ratio of an operating current is increased in the field effect transistor 20 according to the current embodiment.

Figure 6:
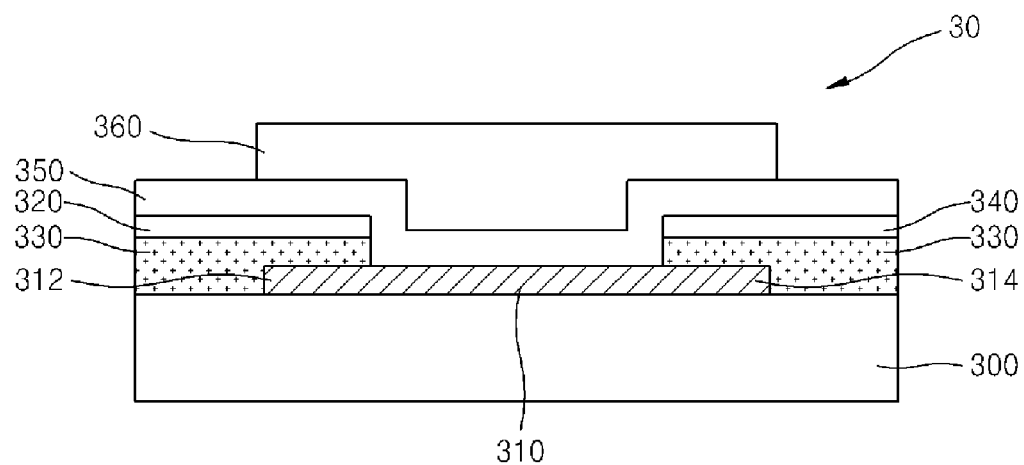
FIG. 6 is a cross-sectional view of a field effect transistor including a semiconductor graphene channel layer, according to some embodiments of the present invention.

FIG. 6 is a cross-sectional view of a field effect transistor 30 including a semiconductor graphene channel layer 310, according to some embodiments of the present invention. For convenience of explanation, duplicate descriptions of the same elements of the previous embodiments will be omitted.

Referring to FIG. 6, the field effect transistor 30 includes a substrate 300, the semiconductor graphene channel layer 310, a first electrode 320, interlayers 330, a second electrode 340, a gate insulation layer 350, and a gate electrode 360.

The semiconductor graphene channel layer 310 is disposed on a portion of the substrate 300. The semiconductor graphene channel layer 310 includes a first region 312 and a second region 314 that are apart from each other. The first region 312 and the second region 314 may be disposed at two opposite ends of the semiconductor graphene channel layer 310. The interlayers 330 are disposed on the first region 312 and the second region 314, respectively. The interlayers 330 may extend such that portions of the same are disposed on the substrate 300. The first electrode 320 and the second electrode 340 are disposed on the interlayers 330, respectively. In other words, the first electrode 320 and the second electrode 340 may be disposed on the interlayers 330 in correspondence to the first region 312 and the second region 314, respectively. The first electrode 320 and the second electrode 340 are apart from each other with respect to the semiconductor graphene channel layer 310. The gate insulation layer 350 is disposed on a portion of the semiconductor graphene channel layer 310, the first electrode 320, and the second electrode 340. The gate electrode 360 is disposed on a portion of the gate insulation layer 350.

The substrate 300 may be formed of various materials, as describe above. The semiconductor graphene channel layer 310 may include semiconductor graphene having a band gap between the conduction band and the valence band. The first electrode 320 and the second electrode 340 may be electrically interconnected through the semiconductor graphene channel layer 310, and each may be either a source electrode or a drain electrode. The first electrode 320 and the second electrode 340 may include a conductive material. The gate insulation layer 350 may include an insulation material, and the gate electrode 360 may include a conductive material.

The interlayers 330 may each include a semiconductor material, e.g. silicon, germanium, silicon-germanium, a group III-V semiconductor, or a group II-VI semiconductor. The semiconductor material may have a band gap of a size with which a field effect occurs due to a voltage applied to the gate electrode 360. Furthermore, the interlayers 330 may be doped with either an n-type impurity or a p-type impurity. Particularly, the interlayers 330 may be doped with a high concentration of an impurity of p-type or n-type conductivities, which the degree of concentration is generally indicated as $p^+$ type or $n^+$ type in the art. Here, in case a semiconductor is doped with a high concentration of an impurity, the doped semiconductor may exhibit, for example, material characteristics such as electric conductivity close to that of metals. The n-type impurity may be a group V, such as nitrogen (N), phosphorus (P), arsenic (Ar), antimony (Sb), or Bi. Furthermore, the p-type impurity may be a group III, such as boron (B), Al, gallium (Ga), In, or thallium (Tl). The conductivity type of an impurity implanted into the interlayers 330 may be opposite to the conductivity type of the field effect transistor 30. For example, the interlayers 330 may be doped with a p-type impurity in case of an n-type field effect transistor, whereas the interlayers 330 may be doped with an n-type impurity in case of a p-type field effect transistor.

Figure 7A:
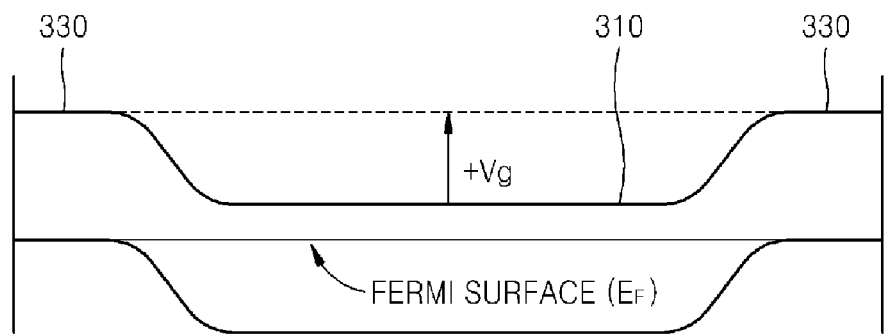
FIGS. 7A and 7B are energy band diagrams for describing the operating principle of the field effect transistor shown in FIG. 4.
Figure 7B:
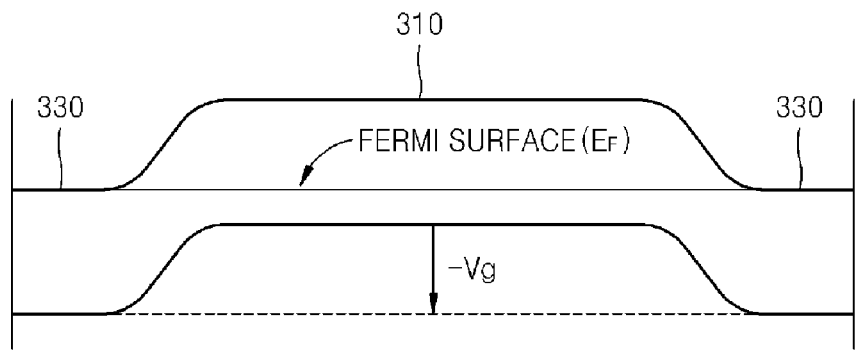

FIGS. 7A and 7B are energy band diagrams for describing the operating principle of the field effect transistor 30 shown in FIG. 4. FIG. 7A illustrates one case when the field effect transistor 30 is n-type, whereas FIG. 7B illustrates another case when the field effect transistor 30 is p-type.

Referring to FIG. 6 and FIG. 7A, in the n-type field effect transistor 30, in case where no voltage is applied to the gate electrode 360, an energy band structure for the semiconductor graphene channel layer 310 and the interlayers 330 is formed do as to have a thermodynamic equilibrium corresponding to work functions of the semiconductor graphene channel layer 310 and the interlayers 330. In case where a positive gate voltage $+V_g$ is applied to the gate electrode 360 of the n-type field effect transistor 30, the conduction band of the semiconductor graphene channel layer 310 rises to the conduction band of the interlayers 330, and thus the energy barrier between the semiconductor graphene channel layer 310 and the interlayers 330 is removed. Therefore, electrons within the semiconductor graphene channel layer 310 can easily move into the interlayers 330, and furthermore, can easily move into the first electrode 320 or the second electrode 340. Thus, the n-type field effect transistor 30 becomes on-state.

Although the field effect transistor 30 of FIG. 6 is shown as an upper gate structure, the present invention is not limited thereto, and thus, according to another embodiment, the field effect transistor 30 may include a lower gate structure disposed under the semiconductor graphene channel layer 310, the first electrode 320, the interlayers 330, and the second electrode 340.

Referring to FIG. 6 and FIG. 7B, in the p-type field effect transistor 30, in case where no voltage is applied to the gate electrode 360, an energy band structure for the semiconductor graphene channel layer 310 and the interlayers 330 is formed do as to have a thermodynamic equilibrium corresponding to work functions of the semiconductor graphene channel layer 310 and the interlayers 330. In case where a negative gate voltage $-V_g$ is applied to the gate electrode 360 of the n-type field effect transistor 30, the valence band of the semiconductor graphene channel layer 310 moves to the valence band of the interlayers 330, and thus the energy barrier between the semiconductor graphene channel layer 310 and the interlayers 330 is removed. Therefore, holes within the semiconductor graphene channel layer 310 can easily move into the interlayers 330, and furthermore, can easily move into the first electrode 320 or the second electrode 340. Thus, the n-type field effect transistor 30 becomes on-state.

The semiconductor graphene channel layer 310 and the interlayers 330 mutually form a semiconductor junction, and form a depletion layer with respect to a voltage applied in a reverse current direction with respect to the semiconductor junction. The depletion layer may trap electrons or holes, thus may decrease an off-current. Therefore, an on/off ratio of an operating current is increased in the field effect transistor 30 according to the current embodiment.

Figure 8:
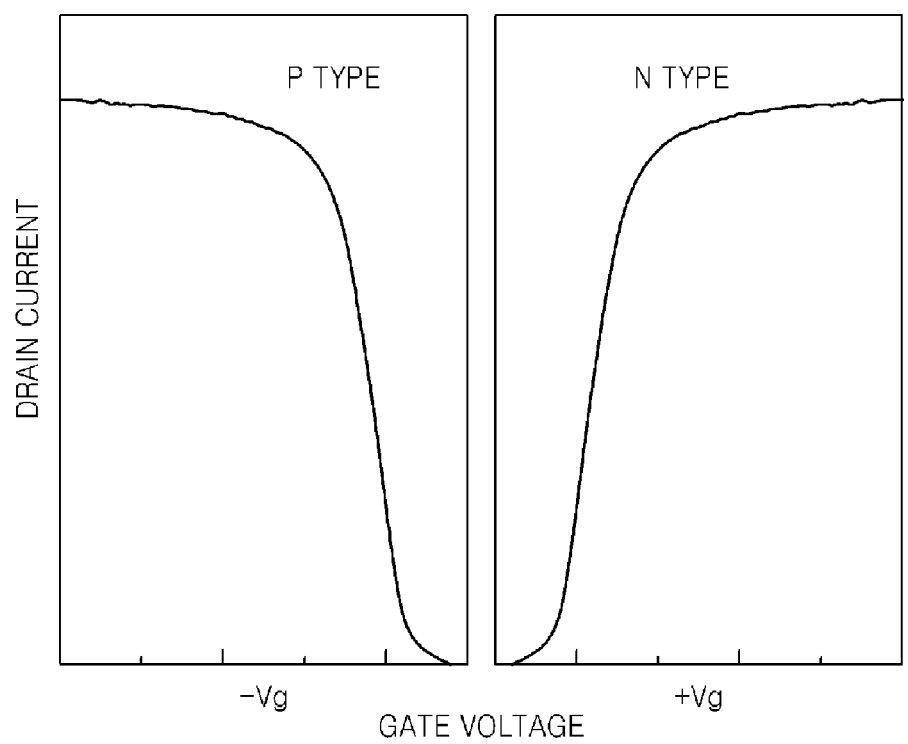
FIG. 8 is a graph schematically showing drain current density according to gate voltages of n-type and p-type field effect transistors including graphene channel layers, according to some embodiments of the present invention.

FIG. 8 is a graph schematically showing drain current density according to gate voltages of n-type and p-type field effect transistors including graphene channel layers, according to some embodiments of the present invention. In FIG. 8, the horizontal axis indicates voltages applied to a gate voltage applied to the gate electrode, whereas the vertical axis indicates a drain current flowing between the first electrode and the second electrode, that is a source electrode and a drain electrode.

Referring to FIG. 8, in the case of the n-type field effect transistor, more drain current flows when a positive gate voltage is applied. In contrast, in the case of the p-type field effect transistor, more drain current flows when a negative gate voltage is applied. Accordingly, a field effect transistor having a graphene channel layer, according to some embodiments of the present invention, does not exhibit ambipolar characteristics, which field effect transistors using graphene generally exhibit, and thus an n-type field effect transistor and a p-type field effect transistor can be separately fabricated.

A field effect transistor including a graphene channel layer, according to some embodiments of the present invention, can reduce off current while maintaining excellent charge mobility. In the case where a graphene channel layer includes semi-metal graphene, leakage current can be prevented due to an insulation layer formed between the graphene channel layer and an electrode. In contrast, in the case where a graphene channel layer includes semiconductor graphene, off-current can be reduced due to the graphene channel layer and a high concentration semiconductor layer formed at two opposite sides of the graphene channel layer.

Furthermore, since a field effect transistor including a graphene channel layer, according to some embodiments of the present invention, does not exhibit ambipolar characteristics, an n-type transistor and a p-type transistor can be separately fabricated. Thus, according to the present invention, a graphene field effect transistor which has a very large on/off ratio operating current and satisfies complementary metal-oxide semiconductor (CMOS) techniques for high speed and large integration may be formed.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A field effect transistor, comprising:
    a substrate;
    a graphene channel layer which is disposed on a portion of the substrate and comprises graphene;
    a first electrode disposed on a first region of the graphene channel layer and on a portion of the substrate;
    an interlayer disposed on a second region of the graphene channel layer, which is spaced apart from the first region, and on a portion of the substrate;
    a second electrode disposed on the interlayer;
    a gate insulation layer disposed on a portion of the graphene channel layer, the first electrode, and the second electrode; and
    a gate electrode disposed on a portion of the gate insulation layer,
    wherein the interlayer comprises an insulation layer.

2. The field effect transistor of claim 1, wherein the graphene is semi-metal graphene having no band gap and the level of the Fermi surface changes by a voltage applied to the gate electrode.

3. The field effect transistor of claim 1, wherein the second electrode overlaps with the graphene channel layer and the interlayer is interposed therebetween.

4. The field effect transistor of claim 1, wherein the second electrode covers the interlayer either completely or partially.

5. The field effect transistor of claim 1, wherein a thickness of the interlayer is sufficient to cause a tunnelling effect between the graphene channel layer and the second electrode.

6. The field effect transistor of claim 1, wherein each of the first electrode and the second electrode is either a source electrode or a drain electrode.

7. A field effect transistor, comprising:
    a substrate;
    a graphene channel layer which is disposed on a portion of the substrate and comprises graphene;
    a first electrode disposed on a first region of the graphene channel layer and on a portion of the substrate;
    an interlayer disposed on a second region of the graphene channel layer, which is spaced apart from the first region, and on a portion of the substrate;
    a second electrode disposed on a portion of the interlayer;
    a gate insulation layer disposed on a portion of the graphene channel layer, the first electrode, the interlayer, and the second electrode; and
    a gate electrode disposed on a portion of the gate insulation layer,
    wherein the second electrode is spaced apart from the graphene channel layer by an interlayer that is interposed therebetween, and the second electrode and the graphene channel layer do not overlap.

8. The field effect transistor of claim 7, wherein the graphene is semi-metal graphene having no band gap and the level of the Fermi surface changes by a voltage applied to the gate electrode.

9. The field effect transistor of claim 7, wherein the interlayer comprises a semiconductor having a band gap of a size with which a field effect occurs due to a voltage applied to the gate electrode.

10. The field effect transistor of claim 7, wherein a thickness interlayer is sufficient to cause a tunnelling effect between the graphene channel layer and the second electrode.

11. The field effect transistor of claim 7, wherein the interlayer comprises semiconductor graphene or graphene oxide.

12. The field effect transistor of claim 7, wherein the interlayer has a first portion and a second portion,
    wherein the first portion of the interlayer is interposed between the first electrode and the graphene channel layer,
    wherein the second portion of the interlayer is interposed between the second electrode and the graphene channel layer.

* * * * *